(12) United States Patent
Dudgeon et al.

(10) Patent No.: US 7,834,795 B1
(45) Date of Patent: Nov. 16, 2010

(54) COMPRESSIVE SENSOR ARRAY SYSTEM AND METHOD

(75) Inventors: Dan E. Dudgeon, Acton, MA (US); Jason N. Laska, Houston, TX (US); Cory S. Myers, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 47 days.

(21) Appl. No.: 12/474,128

(22) Filed: May 28, 2009

(51) Int. Cl.
*H03M 1/10* (2006.01)
(52) U.S. Cl. .................. 341/155; 702/189; 702/196
(58) Field of Classification Search ............... 341/155; 702/189, 190, 196, 197
See application file for complete search history.

(56) References Cited

U.S. PATENT DOCUMENTS

| | | | |
|---|---|---|---|
| 4,166,980 A * | 9/1979 | Apostolos et al. | ............ 375/316 |
| 7,271,747 B2 | 9/2007 | Baraniuk et al. | |
| 7,289,049 B1 | 10/2007 | Fudge et al. | |
| 7,345,603 B1 | 3/2008 | Wood et al. | |
| 7,450,032 B1 | 11/2008 | Cormode et al. | |
| 7,511,643 B2 | 3/2009 | Baraniuk et al. | |
| 7,688,068 B2 | 3/2010 | Beatty | |
| 2006/0239336 A1 | 10/2006 | Baraniuk et al. | |
| 2007/0027656 A1* | 2/2007 | Baraniuk et al. | ............. 702/189 |
| 2008/0062028 A1* | 3/2008 | Chang | ......................... 341/155 |
| 2008/0228446 A1* | 9/2008 | Baraniuk et al. | ............. 702/189 |
| 2009/0222226 A1 | 9/2009 | Baraniuk et al. | |
| 2010/0001901 A1 | 1/2010 | Baraniuk et al. | |

FOREIGN PATENT DOCUMENTS

WO 2007050680 5/2007

OTHER PUBLICATIONS

Ragheb et al., A Prototype Hardware for Random Demodulation Based Compressive Analog-to-Digital Conversion, IEEE 51st Midwest Symposium on Circuits and Systems, Aug. 2008, pp. 37-40.*
D. Donoho, "Compressed Sensing." IEEE Trans. on Information Theory, vol. 52(4), pp. 1289-1306, Apr. 2006.
E. Candes, J. Romberg and T. Tao, "Robust uncertainty principles: Exact signal reconstruction from highly incomplete frequency information." IEEE Trans. on Information Theory, vol. 52(2) pp. 489-509, Feb. 2006.

(Continued)

*Primary Examiner*—Howard Williams
(74) *Attorney, Agent, or Firm*—Finch & Maloney PLLC; Neil F. Maloney

(57) ABSTRACT

A compressive sensor array (CSA) system and method uses compressive sampling techniques to acquire sensor data from an array of sensors without independently sampling each of the sensor signals. In general, the CSA system and method uses the compressive sampling techniques to combine the analog sensor signals from the array of sensors into a composite sensor signal and to sample the composite sensor signal at a sub-Nyquist sampling rate. At least one embodiment of the CSA system and method allows a single analog-to-digital converter (ADC) and single RF demodulation chain to be used for an arbitrary number of sensors, thereby providing scalability and eliminating redundant data acquisition hardware. By reducing the number of samples, the CSA system and method also facilitates the processing, storage and transmission of the sensor data.

20 Claims, 7 Drawing Sheets

OTHER PUBLICATIONS

R. Venkataramani and Y. Bresker, "Optimal Sub-Nyquist Nonuniform Sampling and Reconstruction for Multiband Signals" IEEE Trans. on Signal Proc., vol. 49, No. 10, Oct. 2001.

Y. C. Eldar, "Compressed sensing of analog signals." Preprint, 2008.

A. Gilbert, S. Muthukrishnan, and M. Strauss, "Improved time bounds for near-optimal sparse Fourier representation via sampling." SPIE Wavelets XI, San Diego, California, Sep. 2005.

E. Candes and T. Tao, "Near optimal signal recovery from random projections: Universal encoding strategies?" IEEE Trans. on Information Theory, vol. 52(12), pp. 5406-5425, Dec. 2006.

J. Tropp, M. Wakin, M. Duarte, D. Baron, and R Baraniuk, "Random filters for compressive sampling and reconstruction." IEEE Int. Conf. on Acoustics, Speech, and Signal Processing (ICASSP), Toulouse, France, May 2006.

J. Laska, S. Korolos, M. Duarte, T. Ragheb, R. Baraniuk, and Y. Massoud, "Theory and implementation of an analog-to-information converter using random demodulation." IEEE Int. Symp. on Circuits and Systems (ISCAS), New Orleans, Louisiana, 2007.

J. Tropp, J. Laska, M. Duarte, and R. Baraniuk. "Beyond Nyquist." Preprint. 2008.

E. Candes, J. Ronberg, and T.e Tao, "Stable signal recovery from incomplete and inaccurate measurements." Communications on Pure and Applied Mathematics, vol. 59(8), pp. 1207-1223, Aug. 2006.

J. Tropp and A. Gilbert, "Signal recovery from random measurements via orthogonal matching pursuit." IEEE Trans. on Information Theory, vol. 53(12) pp. 4655-4666, Dec. 2007.

D. Needell and J. A. Tropp, "CoSaMP: Iterative signal recovery from incomplete and inaccurate samples." Preprint, 2008.

E. T. Hale, W. Tin, and Y. Zhang, "A fixed-point continuation method for ell-1 regularized minimization with applications to compressed sensing." Preprint, 2007.

M. Cetin, D. M. Malioutov, and A. S. Willsky. "A Variational Technique for Source Localization Based on a Sparse Signal Reconstruction Perspective." IEEE Int. Conf. on Acoustics, Speech, and Signal Processing (ICASSP), Orlando, Florida, May 2002.

E. Candes, Compressive sampling,' in Int. Congress of Mathematics, 2006, vol. 3, pp. 1433-1452.

F.J. Hermann and G. Hennenfent, "Non-parametric seismic data recovery with curvelet frames," in UBC Earth and Ocean Sciences Department Technical Report TR-2007-1, 2007.

E. Candes, T. Tao, "Near-optimal signal recovery from random projections: Universal encoding strategies?" , IEEE Transactions on Information Theory, vol. 52, No. 12, Dec. 2006.

Jerri, "The Shannon Sampling Theorem—Its various extensions and applications: A tutorial review," Proceedings of the IEEE, vol. 65, No. 11, Nov. 1977.

Emamnuel J. Candes, Compressive Sampling, Proceedings of the International Congress of Mathematicians, European Mathematical Society, 2006, 20 pages, Madrid, Spain.

Dan E. Dudgeon, Fundamentals of Digital Array Processing, Proceedings of the IEEE, Jun. 1977, 7 pages, vol. 65, No. 6.

Abdul J. Jerri, The Shannon Sampling Theorem—Its Various Extensions and Applications: A Tutorial Review, Proceedings of the IEEE, Nov. 1977, 32 pages, vol. 65, No. 11.

Holger Rauhut, Random sampling of sparse trigonometric polynomials—Abstract, NuHAG, Faculty of Mathematics, University of Vienna, Nordbergstrasse 15, A-1090 Wien, Austria, May 11, 2006, 1 page.

Volkan Cevher et al., Compressive Wireless Arrays for Bearing Estimation of Sparse Sources in Angle Domain, Advanced Sensors Consortium, IEEE Int. Conf. on Acoustics, Speech, and Signal Processing (ICASSP), Las Vegas, Nevada, Apr. 2008, 4 pages.

Ali C. Gurbuz et al., A Compressive Beamforming Method, MURI by the U.S. Army Research Office, IEEE Int. Conf. on Acoustics, Speech, and Signal Processing (ICASSP), Las Vegas, Nevada, Apr. 2008, 4 pages.

* cited by examiner

COMPRESSIVE SENSOR ARRAY SYSTEM AND METHOD

FIELD OF THE INVENTION

The invention relates to sensor arrays, and more particularly, to a compressive sensor array that uses compressive sampling techniques.

BACKGROUND OF THE INVENTION

Sensor array systems generally include multiple sensors arranged in an array such that each of the sensors measures a physical quantity generated by one or more emitting sources and converts the physical quantity into a representative signal. The representative signal generated by each sensor is often an analog signal (e.g., an RF signal) representative of the physical quantity measured by the sensors. To acquire sensor data for processing, the analog sensor signals may be demodulated to a baseband frequency (e.g., using RF demodulation) and converted to digital signals. By acquiring data from an array of sensors, a sensor array system may be used to determine information about a signal of interest, such as a direction-of-arrival, and about the source, such as the location.

In existing sensor array systems, parallel acquisition hardware is often used for each sensor in the array. Following each sensor, an existing sensor array system may include, for example, an analog RF chain composed of filters and mixers used to demodulate the received signal and an analog-to-digital converter (ADC) to sample each of the demodulated analog signals. Because these components perform the same functions for each sensor, this parallel acquisition hardware results in a redundant bank of complex components, which may be expensive and power intensive. Additionally, the amount of collected data grows linearly with the number of sensors in a sensor array system with redundant data acquisition hardware. In other words, for $N_k$ sensors, there is $N_k$ times more digital sensor data than with a single sensor and receiver. Increasing the number of sensors in such a system may thus require larger storage, higher transmission data rates and faster processing capabilities.

The spatial resolution of a sensor array may be dependent on the size of its aperture, and for a fixed sensor spacing, the number of sensors. Applications for sensor arrays have demanded higher spatial resolutions and thus an increased number of sensors, which results in more complex array acquisition hardware and larger amounts of data. In many applications, there are only a few emitting sources of interest. A sensor array may be used, for example, to look for the direction from which a single source is emitting. Although increasing the number of sensors in an array produces higher precision results with regard to the direction of the source, it comes at the cost of acquiring high resolution information about all of the other directions that do not contain the signal of interest. Thus, a system with more complex hardware is used to acquire more samples than are needed. Reducing the bottleneck created by the parallel acquisition hardware in existing sensor array systems would be advantageous in such systems.

Compressive sampling techniques have been applied to reduce the number of samples required to represent certain types of signals. According to the Shannon sampling theorem, a bandlimited signal can be uniquely represented by uniform time-samples if it is sampled at the Nyquist rate (twice the bandwidth) or faster. In existing sensor array systems with parallel acquisition hardware, each of the parallel ADCs often sample the sensor signals at the Nyquist rate determined by the bandwidth of the channel that each sensor receives. According to compressive sampling theory, a large class of signals known as sparse signals may be sampled significantly more efficiently than Shannon's theorem implies. A sparse signal is generally known as a signal that can be compactly or efficiently represented by a relatively small number of basis functions (e.g., nonzero coefficients) in some basis (e.g., time, frequency, wavelet, etc.). Many communications signals, for example, are composed of just a few sinusoids and thus may be represented by just a few nonzero coefficients in the Fourier domain. Compressive sampling techniques have been used to obtain the nonzero coefficients with much fewer samples than sampling at the Nyquist rate. Merely using compressive sampling in each of the ADCs of an existing sensor array system, however, does not eliminate the redundant acquisition hardware in sensor arrays.

SUMMARY OF THE INVENTION

One embodiment of the present invention provides a compressive sensor array (CSA) acquisition system. The CSA acquisition system includes a CSA modulation system for receiving a plurality of analog sensor signals from an array of sensors, for modulating the analog sensor signals based on a random modulation sequence to establish a sparse measurement basis, and for combining the modulated analog sensor signals to produce a composite analog sensor signal. The CSA acquisition system also includes an analog-to-digital converter (ADC) for converting the composite analog sensor signal to a composite digital sensor signal by sampling at a sub-Nyquist sampling rate, and wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

Another embodiment of the present invention provides a compressive sensor array (CSA) system. The CSA system includes a plurality of sensors for producing a plurality of analog sensor signals, wherein each of the signals is capable of being compressed and represented in a sparsity basis. The CSA system also includes a CSA modulation system for receiving a plurality of analog sensor signals from the sensors, for modulating the analog sensor signals based on a random modulation sequence to establish a sparse measurement basis, and for combining the modulated analog sensor signals to produce a composite analog sensor signal, wherein the sparse measurement basis is incoherent with the sparsity basis. The CSA system further includes an analog-to-digital converter (ADC) for converting the composite analog sensor signal to a composite digital sensor signal by sampling at a sub-Nyquist sampling rate, and wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

A further embodiment of the present invention provides a method of acquiring a plurality of sensor signals from a sensor array. The method includes: receiving a plurality of analog sensor signals from the sensor array; modulating each of the analog sensor signals based on a random modulation sequence to establish a sparse measurement basis; producing a composite analog sensor signal including a combination of the modulated analog sensor signals; passing the composite analog sensor signal through an analog-to-digital converter (ADC) to convert the composite analog sensor signal into a composite digital sensor signal by sampling the composite analog sensor signal at a sub-Nyquist sampling rate, wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

A compressive sensor array (CSA) system and method, consistent with embodiments described herein, generally uses compressive sampling techniques to acquire sensor data in a compressed form from an array of sensors without independently sampling each of the sensor signals. In general, the CSA system and method uses the compressive sampling techniques to combine the analog sensor signals from the array of sensors into a composite sensor signal and to sample the composite sensor signal at a sub-Nyquist sampling rate. As will be described in greater detail below, at least one embodiment of the CSA system and method allows a single analog-to-digital converter (ADC) and single RF demodulation chain to be used for an arbitrary number of sensors, thereby providing scalability and eliminating redundant data acquisition hardware. By reducing the number of samples, the CSA system and method also facilitates the processing, storage and transmission of the sensor data.

Figure 1:
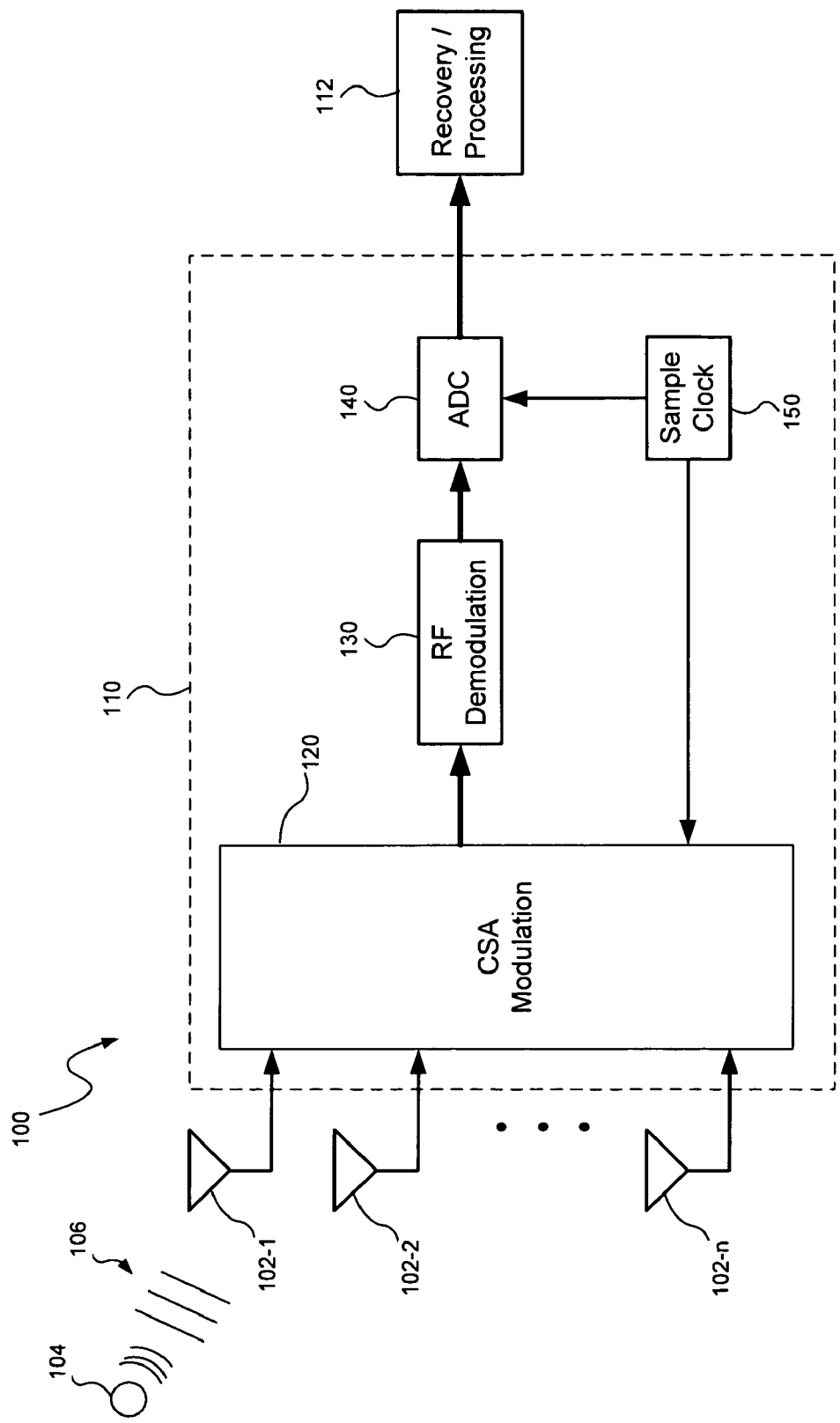
FIG. 1 is a functional block diagram of a compressive sensor array (CSA) system, in accordance with an embodiment of the present invention.

Referring to FIG. 1, an embodiment of a CSA system 100 generally includes a plurality of sensors 102-1 to 102-n, a CSA data acquisition system 110 coupled to the sensors 102-1 to 102-n, and a sensor data recovery/processing system 112 coupled to the data acquisition system 110. The sensors 102-1 to 102-n provide analog sensor signals representing one or more signals of interest and the CSA data acquisition system 110 uses compressive sampling techniques to acquire sparse or compressed representations of the sensor data from the analog signals. The sensor data recovery/processing system 112 recovers the sensor data from the compressed representations and processes the sensor data to obtain information about the signal of interest (e.g., a direction-of-arrival) and/or about the source of the signal (e.g., a location).

The sensors 102-1 to 102-n generally sense a physical quantity emitted from one or more emitting sources 104 and convert the physical quantity into the analog sensor signals. According to one application, the CSA system 100 may be used in source localization applications to locate electromagnetic emitting sources and the sensors 102 may sense electromagnetic energy. The CSA systems and methods described herein may also be used in other applications, for example, in geophysical applications such as seismic data acquisition. When the emitting source 104 lies in the far-field, the energy emitted from the source 104 that impinges on the sensors 102-1 to 102-n may be approximated as a plane wave 106. Thus, the signal(s) of interest represented by the analog sensor signals may be represented as one or more plane waves 106. Although exemplary embodiments are described in the context of the acquisition of plane wave signals, other forms of signals (e.g., spherical wave signals) may be detected and acquired using the systems and methods described herein.

The sensors 101-1 to 102-n may include an array of sensors that is spatially one-dimensional (i.e., a linear array), two-dimensional (i.e., a planar array), or three dimensional (i.e., a volumetric array). Although a sensor array often includes evenly spaced sensors (e.g., a uniform linear array or a uniform planar array), a sensor array may also include sensors that are not evenly spaced or where only a subset of the sensors is evenly spaced.

The CSA acquisition system 110 receives the analog sensor signals from the array of sensors 102-1 to 102-n and acquires the sensor data in a sparse or compressed form using the compressive sampling techniques. An embodiment of the CSA acquisition system 110 includes a CSA modulation system 120, an RF demodulation system 130, and an analog-to-digital converter (ADC) 140. In general, the CSA modulation system 120 modulates the analog sensor signals to establish a compressive sampling measurement basis and combines the modulated analog sensor signals to produce a composite analog sensor signal. The ADC 140 digitizes the composite analog sensor signal to produce a composite digital sensor signal that includes a compressed representation of the sensor data. To accomplish the compressive sampling, the ADC 140 samples the composite analog sensor signal at a sub-Nyquist sampling rate that is coordinated with the modulation of the analog sensor signals, as described in greater detail below. A sample clock 150, for example, may provide the same clock signal to both the CSA modulation system 120 and the ADC 140 to coordinate the modulation and sampling. The ADC 140 may include circuitry known to those skilled in the art for sampling and digitizing analog signals.

The RF demodulation system 130 demodulates the composite sensor signal to bring the composite sensor signal down to a baseband frequency. The RF demodulation system 130 may include circuitry known to those skilled in the art for demodulating an analog RF signal, such as a chain of analog filters and mixers. The use of compressive sampling techniques allows a single RF demodulation system 130 for demodulating the composite sensor signal instead of separate RF demodulation systems following each of the sensors, although this is not a limitation of the present invention. In other embodiments, parallel RF demodulation systems may be used to demodulate each of the analog sensor signals before combining the sensor signals to form the composite sensor signal. Other embodiments of the CSA system and method may not include an RF demodulation system, for example, in applications where the sensor signals are already at a relative low frequency (so-called baseband signals).

Figure 2:
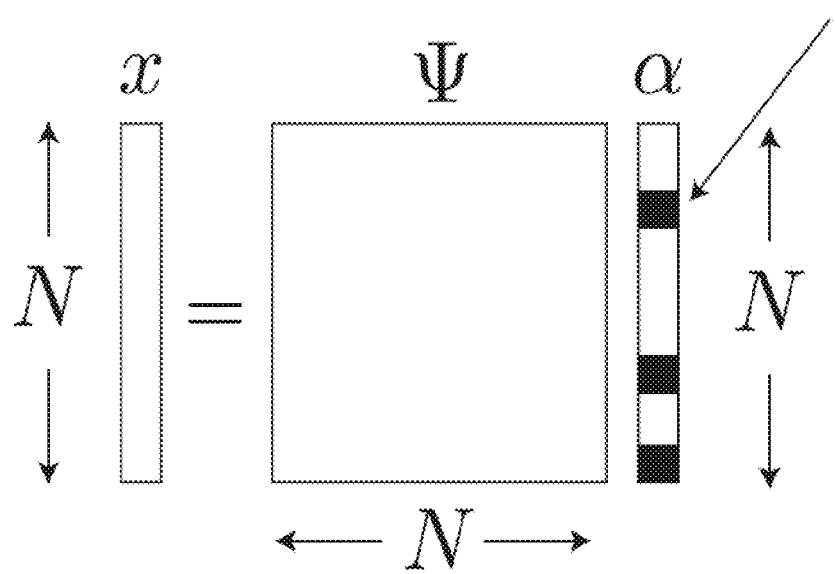
FIG. 2 is a diagram illustrating a matrix representation of a sparse signal.
Figure 3:
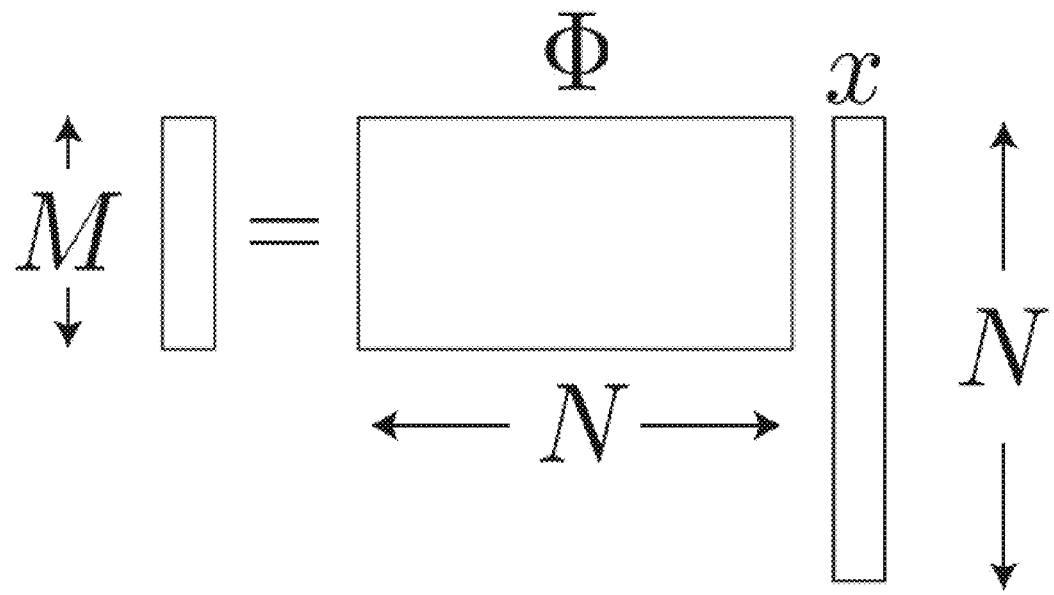
FIG. 3 is a diagram illustrating a matrix representation of a measurement of a sparse signal using a measurement basis.

Before describing the CSA acquisition system 110 in further detail, the application of compressive sampling theory to data acquisition is described in reference to FIGS. 2 and 3. Compressive sampling theory is based on the assumption that the content of a signal x may be compactly or efficiently represented in some way. Many communications signals may be composed of a few sinusoids, for example, and thus may be efficiently represented in the Fourier domain. In many sensor array applications, there are often only a few emitting sources and the received signal can be sparsely represented as a sum of plane waves (i.e., in the far field), for example, using just a few wavenumber, frequency pairs.

According to compressive sampling theory, a coefficient vector $\alpha \in \mathbb{R}^N$ is K-sparse in some basis (referred to as a sparsity basis) if it contains only K<N nonzero elements and a signal x is K-sparse in a dictionary $\Psi$ if x can be written as $x = \Psi\alpha$, where the coefficient vector $\alpha$ is sparse. The dictionary $\Psi$ is a generic model from which a signal can be constructed and may include a collection of elements drawn from the signal space whose linear combinations can be used to represent or approximate signals. As shown in FIG. 2, for example, a sparse signal x may be represented in matrix form as a dictionary $\Psi$ including an N×N matrix of elements and a coefficient vector $\alpha$ including an N×1 matrix of elements. In this matrix representation, the coefficient vector $\alpha$ is K-sparse because a relatively small number K of the total number N coefficients are nonzero. In practice, many signals are not strictly sparse. In some cases, signals may contain noise. In other cases, the exact representation of a signal may require many nonzero coefficients but is closely approximated by the K largest coefficients. Even if a signal $\alpha$ is not strictly sparse, the signal $\alpha$ is compressible if it can be well approximated by only K coefficients. In particular, if the coefficient magnitudes of $\alpha$ are sorted and decay rapidly according to a power-law, i.e., $\|\alpha\|_1 \leq C$, then $\alpha$ is compressible.

According to compressive sampling techniques, a sparse or compressible signal x may be represented with only M measurements of the signal x such that K<M<<V, as shown in FIG. 3. The signal x may be projected onto a sparse measurement basis $\Phi$ (e.g., represented as a matrix with the dimension M×N) such that the measurements y are represented as $y = \Phi x$. As shown, projecting the signal x onto the sparse measurement basis $\Phi$ results in a measurement y with fewer elements than the original signal x. In general, the measurement basis $\Phi$ is incoherent with the sparsity basis (i.e., $\Psi$) and the measurement basis $\Phi$ has a property such that for every K-sparse signal there is a unique mapping to y. One example of a measurement basis $\Phi$ is a random measurement basis, for example, including a matrix where each element is drawn from a probability distribution such as Gaussian, Bernoulli or Rademacher probability distributions. Other sparse measurement bases that are known for use in compressive sampling may be based on random filters, random demodulators and random sampling.

For some compressive sampling acquisition systems, the number of measurements M to perform well (i.e., to allow recovery of the original signal) may be represented as follows:

$$M \sim CK \log\left(\frac{N}{K} + 1\right) \qquad \text{Eq. 1}$$

where the constant C depends on the measurement basis $\Phi$ and is usually not much larger than 1. For a sparse or compressible signal x, therefore, a condensed representation y may be acquired with little or no information loss through dimensionality reduction.

A signal x that has been projected onto a sparse measurement basis $\Phi$ may be reconstructed from the relatively small set of projections onto the measurement basis $\Phi$, for example, using convex optimization techniques known to those skilled in the art. With measurements y, for example, the signal x may be recovered by solving the convex optimization as follows:

$$\min_{\hat{\alpha}} \|\hat{\alpha}\|1 \text{ s.t. } y = \Phi\Psi\hat{\alpha} \qquad \text{Eq. 2}$$

A convex optimization technique may thus be applied to look for $\hat{\alpha}$ with the smallest $l_1$-norm such that when $\hat{\alpha}$ is projected back onto the combined basis $\Phi\Psi$, the same measurements y are obtained. Where there is noise on the measurements (i.e., y|a is received with $\|\rho\|_2 < \epsilon$), the signal x may be recovered by solving the convex optimization as follows:

$$\min_{\hat{\alpha}} \|\hat{\alpha}\|1 \text{ s.t. } \|y - \Phi\Psi\hat{\alpha}\|2 < \epsilon \qquad \text{Eq. 3}$$

The error of this recovery is stable and bounded as follows:

$$\|\alpha - \hat{\alpha}\|2 \leq C_1\epsilon + C_2 \frac{\|\alpha - \alpha_K\|1}{\sqrt{K}} \qquad \text{Eq. 4}$$

where $\|\alpha - \oplus_K|_2$ is the best K-term approximation of $\alpha$ and $C_1, C_2$ depend on $\Phi\Psi$. Thus, the reconstruction error may be bounded by a constant multiple of the sample error in addition to a constant multiple of the compression error. In this case, the compression error is defined by the best approximation of the signal.

Recovery algorithms used to perform the convex optimization may include fast L1 solvers known to those skilled in the art, such as iterative reweighted least squares (IRLS), fixed point continuation (FPC), and gradient projection for sparse reconstruction (GPSR). Recovery algorithms may also include greedy solvers known to those skilled in the art such as orthogonal matching pursuit (OMP) and compressive sampling matching pursuit (CoSaMP).

Figure 4:
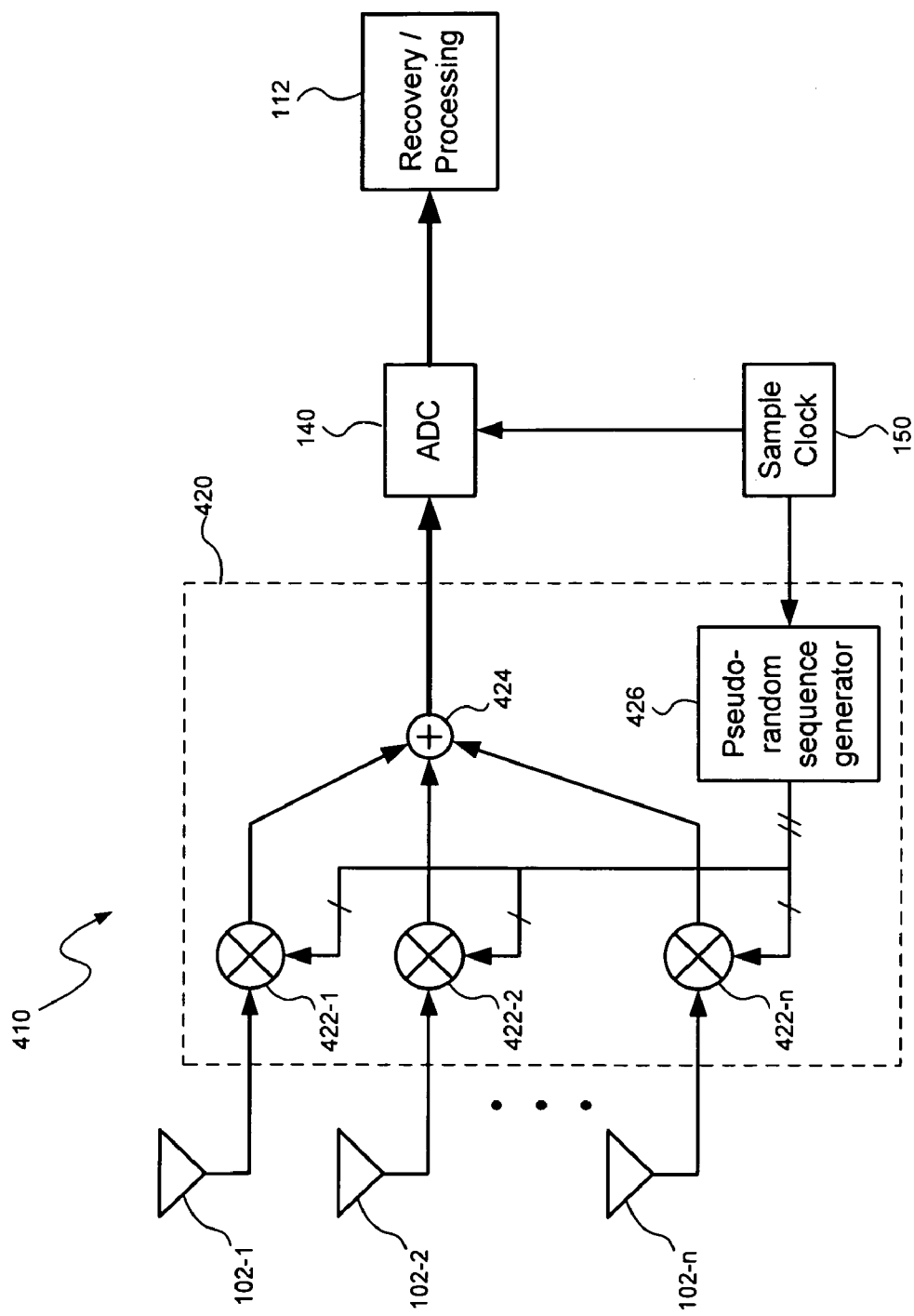
FIG. 4 is a functional block diagram of a CSA system including one embodiment of a CSA acquisition system, which modulates sensor signals using a pseudo-random time-varying sequence to project the sensor signals onto a measurement basis.
Figure 7:
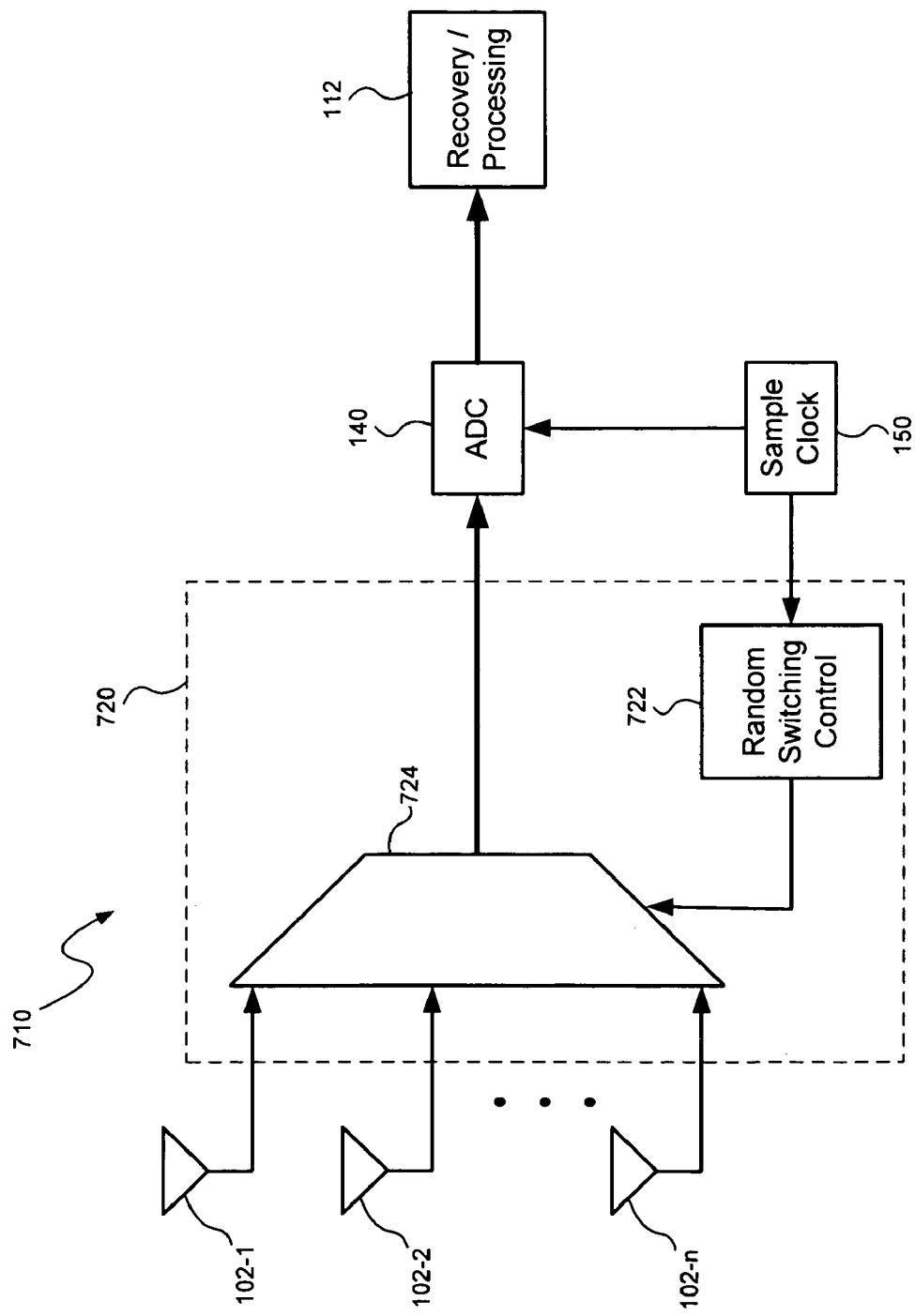
FIG. 7 is a functional block diagram of a CSA system including another embodiment of the CSA acquisition system, which modulates sensor signals using a sparse under-sampling sequence to project the sensor signals onto a measurement basis.

Referring back to FIG. 1, the CSA modulation system 120 and the ADC 140 operate to project the analog sensor signals onto a sparse measurement basis such that the composite digital sensor signal includes sparse digital representations (i.e., measurements) of the analog sensor signals. In general, the analog signals are projected onto the sparse measurement basis by modulating the analog sensor signals based on a random modulation sequence that is coordinated with the sub-Nyquist sampling rate and by sampling the composite analog sensor signal at the sub-Nyquist sampling rate. According to one modulation scheme, the random modulation sequence is a pseudo-random time-varying sequence and the analog signals are modulated by multiplying the signals by the pseudo-random time-varying sequence such that each of the samples corresponds to the sequence. According to another modulation scheme, the random modulation sequence is a sparse undersampling sequence and the analog signals are modulated by randomly selecting sensor signals at the same rate as the sub-Nyquist sampling rate such that only one randomly-selected sensor is active per sample. Embodiments of a CSA modulation system implementing these modulation schemes are shown in FIGS. 4 and 7, respectively, and are described in greater detail below. Other modulation schemes may be used based on other sparse measurement bases known to those skilled in the art.

The recovery/processing system 112 processes the digital data in the composite digital sensor signal to recover accurate representations of the sensor signals from the compressed data in the composite digital sensor signal. The recovery/processing system 112 may include one or more digital signal processors and/or applications for processing the data and may be implemented in hardware, software, firmware or any combination thereof. In general, the recovery/processing system 112 recovers the data using recovery algorithms known to those skilled in the art for recovering compressed data and using a recovery dictionary $\Psi$ that may depend on the type of signals received. As mentioned above, the recovery algorithms may include fast L1 solver algorithms or greedy solver algorithms known for solving convex optimizations. The recover dictionary may include sinusoidal-like dictionaries, such as a wavenumber-frequency dictionary or a Fourier dictionary, which are incoherent with the sparse measurement basis $\Phi$ used to obtain the compressed representation, as will be described in greater detail below.

According to some applications, the CSA system 100 may receive a signal composed of plane waves represented by frequency and wavenumber. In these applications, the emitting source 104 often emits a few large frequencies and the wavenumber corresponds to the direction-of-arrival (e.g., the elevation and azimuth angles) of the signal. A plane wave $x_n$ with coefficient $\alpha_n$ can be represented as follows:

$$x_n(d,t)=\alpha_n \exp\{j(2\pi ft-k \cdot d)\} \quad \text{Eq. 5}$$

where d is a position vector and k is the wavenumber vector. Thus, one recovery dictionary that may be used to recover a signal of plane waves is a wavenumber-frequency dictionary having vectors represented as follows:

$$\exp\{j(2\pi ft-k \cdot d)\} \quad \text{Eq. 6}$$

for all frequencies f and wavenumbers k to be recovered.

Another recovery dictionary that may be used for a signal of plane waves is a Fourier dictionary. Since each sensor receives the plane waves at a specific location, the received signal per sensor may be composed of just a few frequencies. Thus, the data for each sensor is sparse in the Fourier basis. If the number of frequencies per sensor is small enough, then the signal is still sparse enough for recovery using a Fourier dictionary. In this case however, the signal may not be as sparse as with the wavenumber-frequency dictionary since the Fourier dictionary does not take advantage of the joint space-frequency information from the sensors. The recovery/processing system 112 may also use other recovery dictionaries known to those skilled in the art to provide a sparsity basis for the signal of interest and to be incoherent with the measurement basis.

The recovery/processing system 112 may then use the recovered sensor data to determine further information about the signal of interest and/or the emitting source 104. For a plane wave, for example, the wavenumber-frequency recovery provides an accurate estimate of the azimuth and elevation of the emitting source 104. Thus, if wavenumber and angle-of-arrival are desired parameters, no further processing needs to be done after recovery using a wavenumber-frequency dictionary. For other recovery dictionaries, the recovery/processing system 112 may further process the recovered sensor data, for example, using conventional application processing techniques, to determine the desired information.

FIG. 4 shows a CSA acquisition system 410 including a CSA modulation system 420 that modulates the analog sensor signals based on a pseudo-random time-varying sequence. The CSA modulation system 420 includes mixers 422-1 to 422-n for multiplying the analog sensor signals by the pseudo-random time-varying sequence and a combiner 424 coupled to outputs of the mixers 422-1 to 422-n to combine or sum the modulated analog sensor signals to produce the composite analog sensor signal. A pseudo-random sequence generator 426 generates the pseudo-random sequence at a rate that is the same as the sub-Nyquist sampling rate of the ADC 140. The sample clock 150, for example, provides a clock signal to both the ADC 140 and the pseudo-random time-varying sequence generator 426 such that the pseudo-random time-varying sequence is coordinated with the sampling of the ADC 140, i.e., the pseudo-random time-varying sequence changes value at each sample time. One example of a pseudo-random time-varying sequence is a Bernoulli sequence in which each sequence element is chosen to be either of two distinct values with equal probability. For example, the Bernoulli sequence may include a sequence of 0's and 1's or a sequence of +1 or −1 (also referred to as a Rademacher sequence). The pseudo-random time-varying sequence may also be based on other probability distributions such as a Gaussian distribution.

The mixers 422-1 to 422-n may include circuitry known to those skilled in the art for mixing analog signals within the desired frequency range. One example is the frequency mixer available from Mini-Circuits as part number ZX05-11X-S+. The mixers may also be implemented with high fidelity as a polarity switch such that multiplying the signal by a sequence element of +1 or −1 involves inverting the polarity of the signal. The combiner 424 may include circuitry known to those skilled in the art for combining or summing analog signals within the desired frequency range. One example is the combiner available from Mini-Circuits as part number ZBSC-413+.

Figure 5:
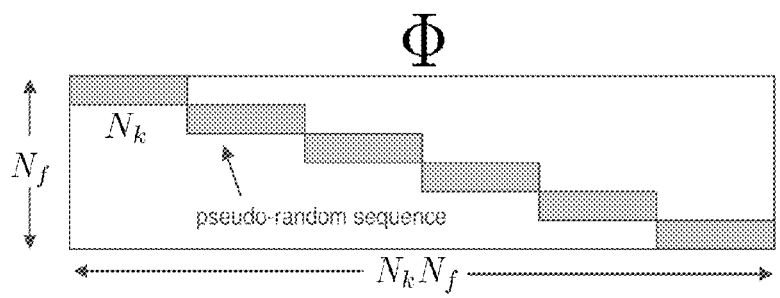
FIG. 5 is a diagram illustrating a matrix representation of a sparse measurement basis established using a pseudo-random time-varying sequence.
Figure 6:
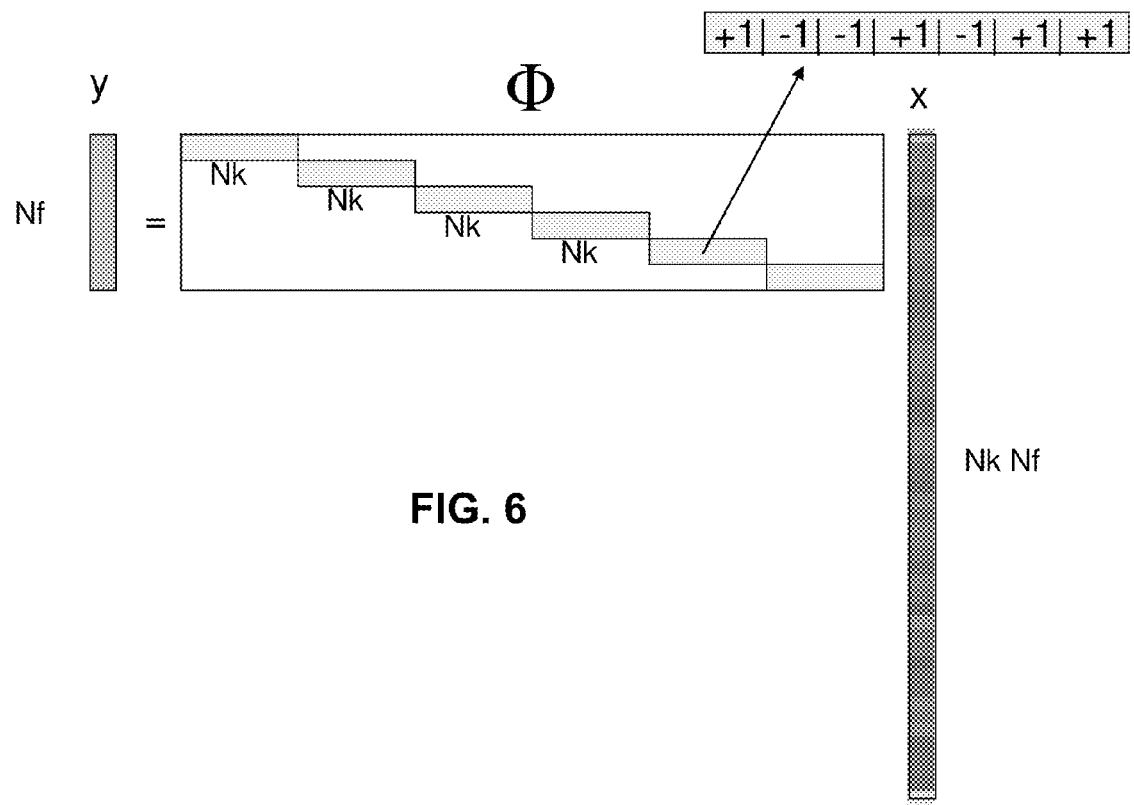
FIG. 6 is a diagram illustrating a matrix representation of a measurement of an array of sensor signals using a sparse measurement basis established using a pseudo-random time-varying sequence.

FIGS. 5 and 6 illustrate a matrix representation of the sparse measurement basis $\Phi$ established using a pseudo-random time-varying sequence and the measurement signal y obtained by projecting a plurality of analog sensor signals onto the sparse measurement basis $\Phi$. As shown in FIG. 5, the sparse measurement basis established by the CSA acquisition system 410 may be represented as a banded $N_f \times N_k N_f$ matrix $\Phi$ of pseudo-random sequence elements (gray regions) and zero elements (white regions), where $N_k$ is the number of sensors and $N_f$ is the number of samples. Each row of the measurement matrix $\Phi$ corresponds to one sample and each row has $N_k$ nonzero elements that correspond to the pseudo-random sequence (e.g., +1, −1, −1, +1, . . . ) on the mixers 422-1 to 422-n during that sample time. The nonzero elements are offset by $N_k$ times the current sample time. For example, if there are $N_k=2$ sensors and $N_f=3$ samples are taken, the resulting matrix $\Phi$ may look like the following:

$$\begin{bmatrix} 1 & -1 & & & & \\ & & -1 & -1 & & \\ & & & & 1 & -1 \end{bmatrix}$$

As shown in FIG. 6, projecting the signal x (representing a combination of the analog sensor signals) onto the sparse measurement matrix $\Phi$ established using the pseudo-random sequence results in the compressed measurement signal y (representing the composite digital sensor signal).

When the $N_f \times N_k N_f$ matrix is used as the sparse measurement basis $\Phi$, the recovery dictionary $\Psi$ for recovering a plane wave signal is a matrix of the size $N_k N_f \times N_k N_f$ because the combined matrix $\Phi\Psi$ is used in recovery. Thus, the resolution in either wavenumber k or frequency f may be chosen independently of each other as long as the number of dictionary elements in the recovery dictionary $\Psi$ is of the size $N_k N_f \times N_k N_f$ and the recovery dictionary $\Psi$ may be designed so that the representations of signals of interest are sparsest. Also, the product of the number of sensors and the number of samples $N_k N_f$ is more important than either quantity alone. In a recovery dictionary $\Psi$ of the size $N_k N_f \times N_k N_f$, however, the columns of the matrix preferably have small inner products with each other similar to the dictionary known for use in solving sparse array problems without compression.

FIG. 7 shows a CSA acquisition system 710 including a CSA modulation system 720 that modulates the plurality of analog sensor signals based on a sparse undersampling sequence by randomly selecting analog sensor signals such that only one of the sensors is active per sample. In this embodiment, the CSA modulation system 720 includes a multiplexor 724 responsive to a random switching control 722. The multiplexor 724 receives the analog sensor signals and selects an active one of the sensor signals to be provided on an output of the multiplexor 724. The random switch control 722 controls the multiplexor 724 to randomly switch between the sensor signals at the same rate as the sampling rate of the ADC 140 such that only of the sensors 102-1 to 102-n is active per sample. The sample clock 150, for example, may provide a clock signal to both the ADC 140 and the random switching control 722 to coordinate the random switching and the sampling. Because only one sensor needs to be active at a time, this embodiment allows power to be reduced. The multiplexor 724 may include multiplexor circuitry known to those skilled in the art multiplexing multiple analog signals at the desired frequency to a single analog signal. The random switching control 722 may include control circuitry known to those skilled in the art for activating the switching of a multiplexor in a random sequence.

In either of the embodiments shown in FIGS. 4 and 7, the sub-Nyquist sampling rate used by the ADC 140 may be related to the number of sensors 102-1 to 102-n and/or sources 104, although various sampling rates and numbers of sensors may be used to achieve the same results. Consistent with Equation 1 above defining the number of measurements that perform well in some compressive sampling acquisition systems, a minimum number of samples $N_f$ may be represented in accordance with the following equation:

$$N_f \geq CK \log\left(\frac{N_f N_k}{K} + 1\right) \quad \text{Eq. 7}$$

which may be rewritten as $$\frac{K\left(e^{\frac{N_f}{CK}} - 1\right)}{N_f} \geq N_K. \quad \text{Eq. 8}$$

The sampling rate is therefore related to the information rate, not the bandwidth of the sensors, and thus may be much lower than the Nyquist rate.

Figure 8:
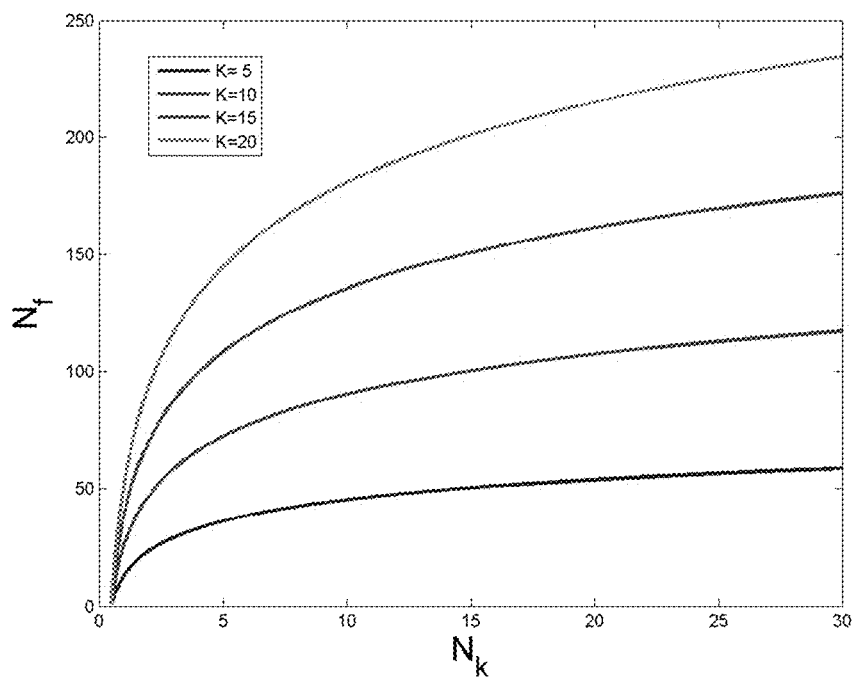
FIG. 8 is a plot of the minimum number of samples versus the number of sensors for different numbers of emitting sources.

FIG. 8 illustrates the relationship defined by the above equations by plotting the number of samples $N_f$ versus the number of sensors $N_k$, for $N_k$ sensors between 1 and 30 and for K sources of 5, 10, 15 and 20, where C=2. As shown, the minimum number of samples $N_f$ grows, but only logarithmically, as the number of sensors $N_k$ increases. As such, the sampling rate may not need to be increased significantly in order to increase the number of sensors (e.g., to increase the wavenumber resolution when sensing a plane wave). The plot shown in FIG. 8 also illustrates the relationship between the number of samples and the number of emitting sources. Thus, the CSA systems described herein may be scalable, not only in hardware, but also in the number of samples required as the number of sensors increase.

Figure 9:
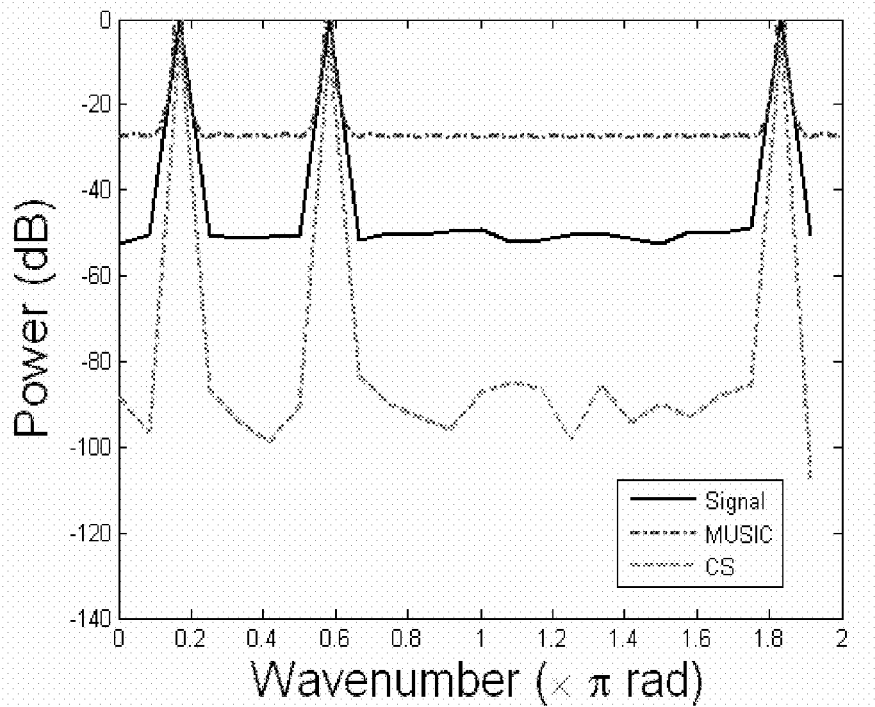
FIG. 9 is a plot of power versus wavenumber for a signal acquired using a simulated CSA system, consistent with an embodiment of the present invention, compared with the actual signal and a signal acquired using a sensor array system with parallel acquisition hardware.

FIG. 9 illustrates the results of a numerical simulation of a CSA system, consistent with an embodiment of the present invention, in comparison with a conventional sensor array including parallel acquisition hardware. The simulated CSA system is based on 24 sensors, 3 plane-wave sources, a measurement basis using a Rademacher (+/−1) probability distribution, and a wavenumber-frequency recovery dictionary. FIG. 9 shows a plot of power versus wavenumber for the simulated CSA system using 1 ADC compared to the actual signal and a conventional system using 24 ADCs for the respective 24 sensors. As shown, the simulated CSA system was able to detect the 3 plane waves using about 4% of the available samples.

FIGS. 10 and 11A-11C illustrate performance as a function of the number of samples obtained in other numerical simulations of a CSA system, consistent with embodiments of the present invention. The simulated CSA system used in these examples is based on 24 sensors with the number of samples $N_f$ varying from 1 to 128 and for different numbers (1, 3, 6, 9 and 12) of plane wave sources. One simulation is conducted without noise (FIG. 10) and another simulation is conducted with Gaussian noise added (FIGS. 11A-11C) with the noise scaled so that the samples have signal-to-noise ratios (SNRs) between 3 dB and 20 dB.

Figure 10:
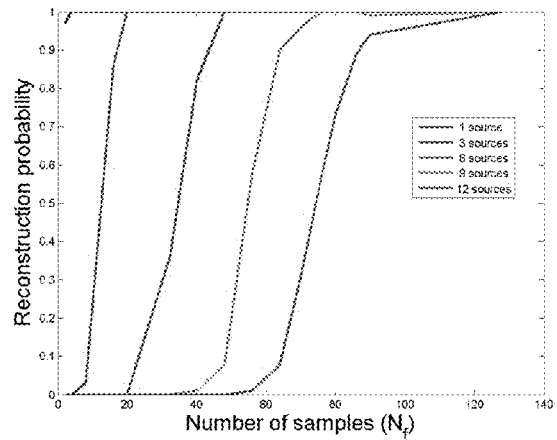
FIG. 10 is a plot of reconstruction probability versus number of samples for a signal acquired using a simulated CSA system without noise.

FIG. 10 shows the probability of the exact recovery of the plane waves versus the number of samples and for the different numbers of sources in the simulation without noise. As illustrated, any one curve for a fixed number of sources (e.g., 9 sources) is relatively steep, indicating a threshold-like effect. Generally, once the number of available samples becomes large enough, the probability of correct reconstruction nears or becomes equal to one. The required number of samples for near-perfect reconstruction grows as the number of sources is increased.

Figure 11A:
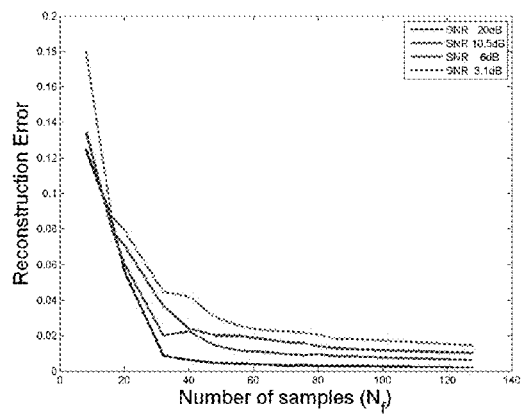
FIG. 11A is a plot of reconstruction probability versus number of samples for a signal acquired using a simulated CSA system with noise.
Figure 11B:
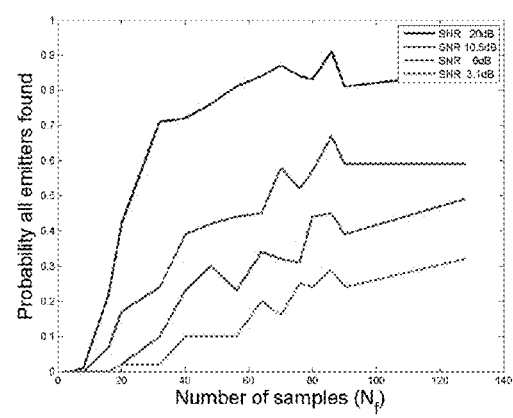
FIG. 11B is a plot of probability of emitters found versus number of samples for a signal acquired using a simulated CSA system with noise.
Figure 11C:
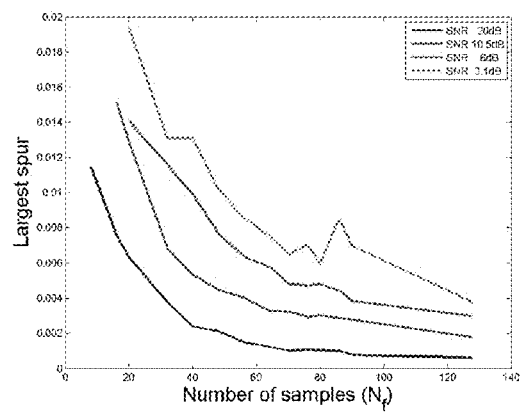
FIG. 11C is a plot of largest spur versus number of samples for a signal acquired using a simulated CSA system with noise.

FIG. 11A shows the reconstruction error versus the number of samples in the simulation with noise. As illustrated, the error drops quickly once enough samples are taken to recover the coefficients of the plane waves. FIG. 11B shows the probability that all of the emitters are located versus the number of samples in the simulation with noise. As illustrated, the probability increases and then plateaus as the number of samples increases. FIG. 11C shows the magnitude of the largest spur versus the number of samples in the simulation with noise. As with the reconstruction error, the largest spur decreases steadily until it reaches some best value after which it does not fluctuate significantly.

According to another simulation, a CSA system was simulated using a real test signal representing a plane wave from a single emitting source. This simulation was conducted using a receiver with 12 sensors and a single ADC was simulated with a pseudo-random time-varying sequence modulation scheme. For this simulation, both a Fourier recovery dictionary and a wavenumber-frequency recovery dictionary were used.

The goal of the simulation was to recover data used to find the elevation and azimuth angles of the emitting source. The results of this simulation indicated that the data was recovered using the Fourier recovery dictionary with 17% of the samples required by a conventional sensor array system and the data was recovered using the wavenumber-frequency dictionary using 3% of the samples required by a conventional sensor array system.

Accordingly, the CSA systems and methods described herein use compressive sampling techniques to provide a scalable architecture requiring only one analog RF chain and one ADC for an arbitrary number of sensors, thereby lowering the cost and power requirements. By reducing the bottleneck created by parallel acquisition hardware, the CSA systems and methods also enable an architecture that uses fewer samples than a conventional sensor array, which facilitates storage, higher transmission data rates and faster processing.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A compressive sensor array (CSA) acquisition system comprising:
   a CSA modulation system for receiving a plurality of analog sensor signals from an array of sensors, for modulating the analog sensor signals based on a random modulation sequence to establish a sparse measurement basis, and for combining the modulated analog sensor signals to produce a composite analog sensor signal; and
   an analog-to-digital converter (ADC) for converting the composite analog sensor signal to a composite digital sensor signal by sampling at a sub-Nyquist sampling rate, and wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

2. The CSA acquisition system of claim 1 further comprising an RF demodulation system following the CSA modulation system for demodulating the composite sensor signal to a baseband frequency.

3. The CSA acquisition system of claim 1 further comprising an RF demodulation system following each of the sensors for demodulating the respective sensor signals to a baseband frequency.

4. The CSA acquisition system of claim 1 further comprising a sampling clock coupled to the ADC and to the CSA modulation system for generating a clock signal at the sub-Nyquist sampling rate.

5. The CSA acquisition system of claim 1 wherein the random modulation sequence is a pseudo-random time-varying sequence, and wherein the CSA modulation system comprises:
   a pseudo-random time-varying sequence generator for producing the pseudo-random time-varying sequence at the sub-Nyquist sampling rate such that the sequence changes value at each sample time;
   a plurality of mixers for multiplying the respective sensor signals by the pseudo-random time-varying sequence; and
   a combiner coupled to outputs of the mixers for combining the modulated analog sensor signals to produce the composite analog sensor signal.

6. The CSA acquisition system of claim 5 wherein the pseudo-random time-varying sequence is a Bernoulli sequence.

7. The CSA acquisition system of claim 1 wherein the random modulation sequence is a sparse undersampling sequence, wherein the CSA modulation system comprises:
   a multiplexor for selecting an active one of the sensor signals to be provided on an output of the multiplexor; and
   a random switch control coupled to the multiplexor for controlling the multiplexor to select the active one of the sensor signals randomly and at the sub-Nyquist sampling rate such that only one of the sensor signals is active per sample, wherein the randomly selected sensor signals provided on the output of the multiplexor form the composite analog sensor signal.

8. A compressive sensor array system comprising:
   a plurality of sensors for producing a plurality of analog sensor signals, wherein each of the signals is capable of being compressed and represented in a a CSA modulation system for receiving a plurality of analog sensor signals from the sensors, for modulating the analog sensor signals based on a random modulation sequence to establish a sparse measurement basis, and for combining the modulated analog sensor signals to produce a composite analog sensor signal, wherein the sparse measurement basis is incoherent with the sparsity basis; and
   an analog-to-digital converter (ADC) for converting the composite analog sensor signal to a composite digital sensor signal by sampling at a sub-Nyquist sampling rate, and wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

9. The compressive sensor array of claim 8 further comprising:

an RF demodulation system following the CSA modulation system for demodulating the composite signal to a baseband frequency.

10. The compressive sensor array of claim 8 wherein the random modulation sequence is a pseudo-random time-varying sequence, and wherein the CSA modulation system comprises:
- a pseudo-random time-varying sequence generator for producing the pseudo-random time-varying sequence at the sub-Nyquist sampling rate such that the sequence changes value at each sample time;
- a plurality of mixers for multiplying the respective analog sensor signals by the pseudo-random time-varying sequence; and
- a combiner coupled to outputs of the mixers for combining the modulated analog sensor signals to produce the composite analog sensor signal.

11. The compressive sensor array of claim 10 wherein the pseudo-random time-varying sequence is a Bernoulli sequence.

12. The compressive sensor array of claim 8 wherein the random modulation sequence is a sparse undersampling sequence, wherein the CSA modulation system comprises:
- a multiplexor for selecting an active one of the sensor signals to be provided on an output of the multiplexor; and
- a random switch control coupled to the multiplexor for controlling the multiplexor to select the active one of the sensor signals randomly and at the sub-Nyquist sampling rate such that only one of the sensor signals is active per sample, wherein the randomly selected analog sensor signals provided on the output of the multiplexor form the composite analog sensor signal.

13. The compressive sensor array of claim 8 further comprising:
- a recovery/processing system for recovering sensor data from the sparse digital representation of the analog sensor signals.

14. The compressive sensor array of claim 13 wherein the recovery/processing system is configured to recover the sensor data from the sparse digital representation using a recovery dictionary and a recovery algorithm that solves a convex optimization.

15. A method of acquiring a plurality of sensor signals from a sensor array, the method comprising:
- receiving a plurality of analog sensor signals from the sensor array;
- modulating each of the analog sensor signals based on a random modulation
- producing a composite analog sensor signal including a combination of the modulated analog sensor signals;
- passing the composite analog sensor signal through an analog-to-digital converter (ADC) to convert the composite analog sensor signal into a composite digital sensor signal by sampling the composite analog sensor signal at a sub-Nyquist sampling rate, wherein the random modulation sequence is coordinated with the sub-Nyquist sampling rate of the ADC such that the analog sensor signals are projected onto the sparse measurement basis to form the composite digital sensor signal including a sparse digital representation of the analog sensor signals.

16. The method of claim 15 wherein modulating each of the analog sensor signals based on the random modulation sequence comprises:
- generating a pseudo-random time-varying sequence at the sampling rate such that the sequence changes value at each sample time; and
- multiplying each of the analog sensor signals by the pseudo-random time varying sequence to modulate the analog sensor signals, wherein the modulated sensor signals are summed to form the composite analog sensor signal.

17. The method of claim 15 wherein the pseudo-random time-varying sequence is a Bernoulli sequence and each sequence element is chosen to be either +1 or −1.

18. The method of claim 15 wherein modulating each of the analog sensor signals based on the random modulation sequence comprises:
- randomly selecting an active one of the sensor signals at the sub-Nyquist sampling rate such that only one of the sensors is active per sample, wherein the randomly selected analog sensor signals are provided on an output to form the composite sensor signal.

19. The method of claim 15 further comprising demodulating the composite sensor signal to a baseband frequency.

20. The method of claim 18 wherein the analog sensor signals represent plane waves, and further comprising:
- processing the composite digital sensor signal to recover sensor data from the sparse digital representations of the analog sensor signals, wherein the sensor data includes wavenumber data for the plane waves.

* * * * *